United States Patent
Kwok et al.

(10) Patent No.: US 9,483,594 B2
(45) Date of Patent: Nov. 1, 2016

(54) RESET VERIFICATION

(71) Applicant: Mentor Graphics Corporation, Wilsonville, OR (US)

(72) Inventors: Ka-kei Kwok, Saratoga, CA (US); Ping Yeung, Saratoga, CA (US); Priya Viswanathan, Santa Clara, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 90 days.

(21) Appl. No.: 14/476,384

(22) Filed: Sep. 3, 2014

(65) Prior Publication Data

US 2016/0063161 A1 Mar. 3, 2016

(51) Int. Cl.
*G06F 17/50* (2006.01)
*G01R 31/00* (2006.01)

(52) U.S. Cl.
CPC ........... *G06F 17/5045* (2013.01); *G01R 31/00* (2013.01)

(58) Field of Classification Search
CPC ....................................................... G06F 17/50
USPC ......................................................... 716/106
See application file for complete search history.

(56) References Cited

U.S. PATENT DOCUMENTS 7,454,728 B2 * 11/2008 Ly ....................... G06F 17/5022
716/106

* cited by examiner

*Primary Examiner* — Thuan Do
(74) *Attorney, Agent, or Firm* — Mentor Graphics Corporation

(57) ABSTRACT

This application discloses an electronic design automation tool configured to perform one or more static reset checks on reset functionality in a circuit design. The electronic design automation tool can detect the reset functionality in the circuit design, identify a portion of the circuit design having a set of resettable components, and determine whether the portion of the circuit design includes a reset design error based, at least in part, on the reset functionality in the circuit design. The static reset checks can include a domain congruency check, a reset skew check, and a glitch detection check, each of which can identify different design errors that may cause reset functionality in the circuit design to operate improperly.

20 Claims, 7 Drawing Sheets

RESET VERIFICATION

TECHNICAL FIELD

This application is generally related to electronic design automation and, more specifically, to reset verification.

BACKGROUND

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, a specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as Verilog or Very high speed integrated circuit Hardware Design Language (VHDL).

The logic of the circuit can be analyzed to confirm that it will accurately perform the functions desired for the circuit, sometimes referred to as "functional verification." For example, the analysis can include simulating of the logical design, which can show how the logical design responses to transactions or sets of test vectors, for example, generated by a test bench during simulation. Functional verification can include verifying, from the results of the simulation, that the logical design can accurately perform functions for many different aspects of the circuit.

As circuits and their corresponding logical designs become more complex, the task of functional verification becomes increasingly difficult to manage and accomplish. For example, this complexity can include logical designs including multiple power domains, multiple clock domain, multiple different types of resets having various characteristics, or the like. Given the complexity of modern reset functionality in the logical designs, many "bugs" or design flaws are often left unexposed by conventional simulation, leaving system designers unable to adequately verify whether the logical design can properly reset components in the logical design.

SUMMARY

This application discloses tools and mechanisms for reset verification. According to various embodiments, the tools and mechanisms can perform one or more static reset checks on reset functionality in a circuit design. The tools and mechanisms can detect the reset functionality in the circuit design, identify a portion of the circuit design having a set of resettable components, and determine whether the portion of the circuit design includes a reset design error based, at least in part, on the reset functionality in the circuit design. The static reset checks can include a domain congruency check, a reset skew check, and a glitch detection check, each of which can identify different design errors that may cause reset functionality in the circuit design to operate improperly.

DESCRIPTION OF THE DRAWINGS

FIG. 8 illustrates a flowchart showing an example implementation of a reset glitch check according to various embodiments of the invention.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
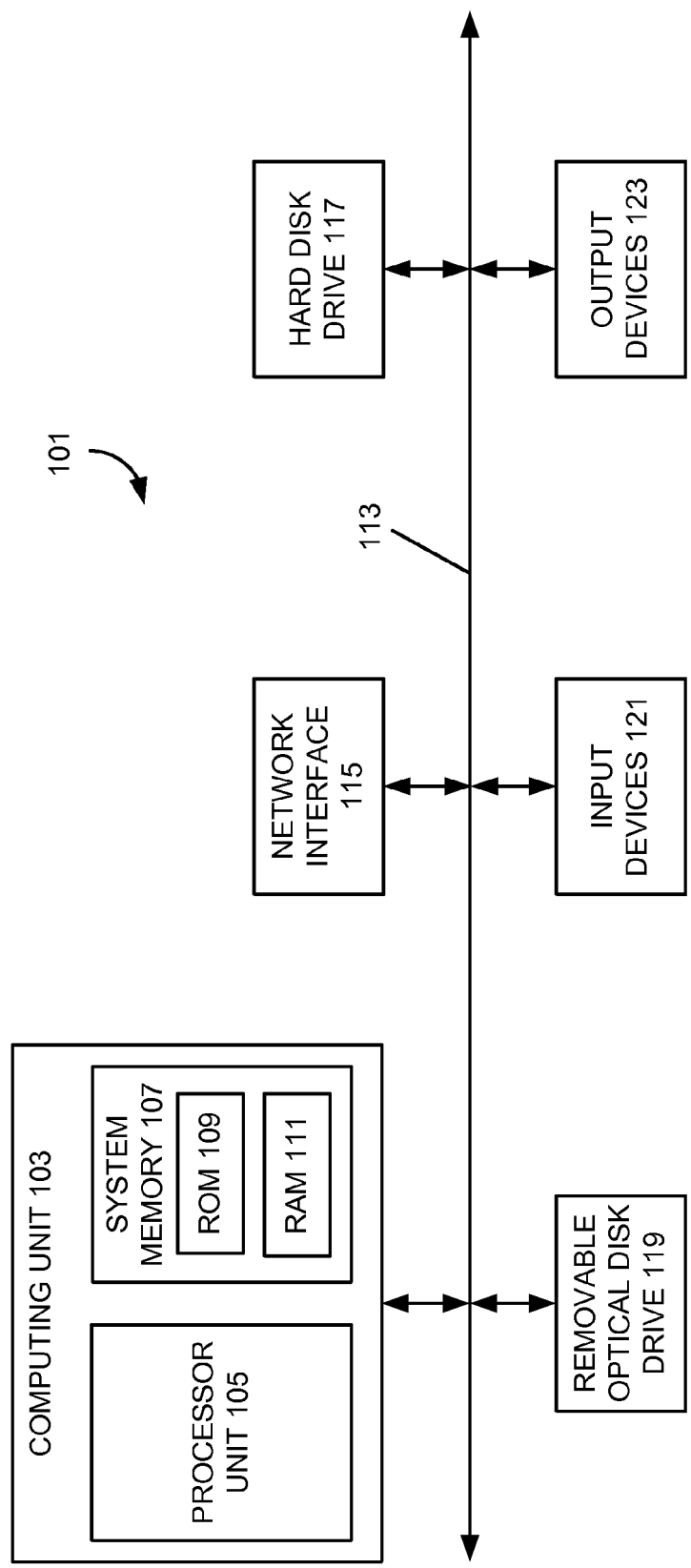
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard"

magnetic disk drive 115, a removable magnetic disk drive 117, an optical disk drive 119, or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computer 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to one or more network interfaces for communicating with other devices making up a network. The network interface translates data and control signals from the computing unit 103 into network messages according to one or more communication protocols, such as the transmission control protocol (TCP) and the Internet protocol (IP). Also, the interface may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
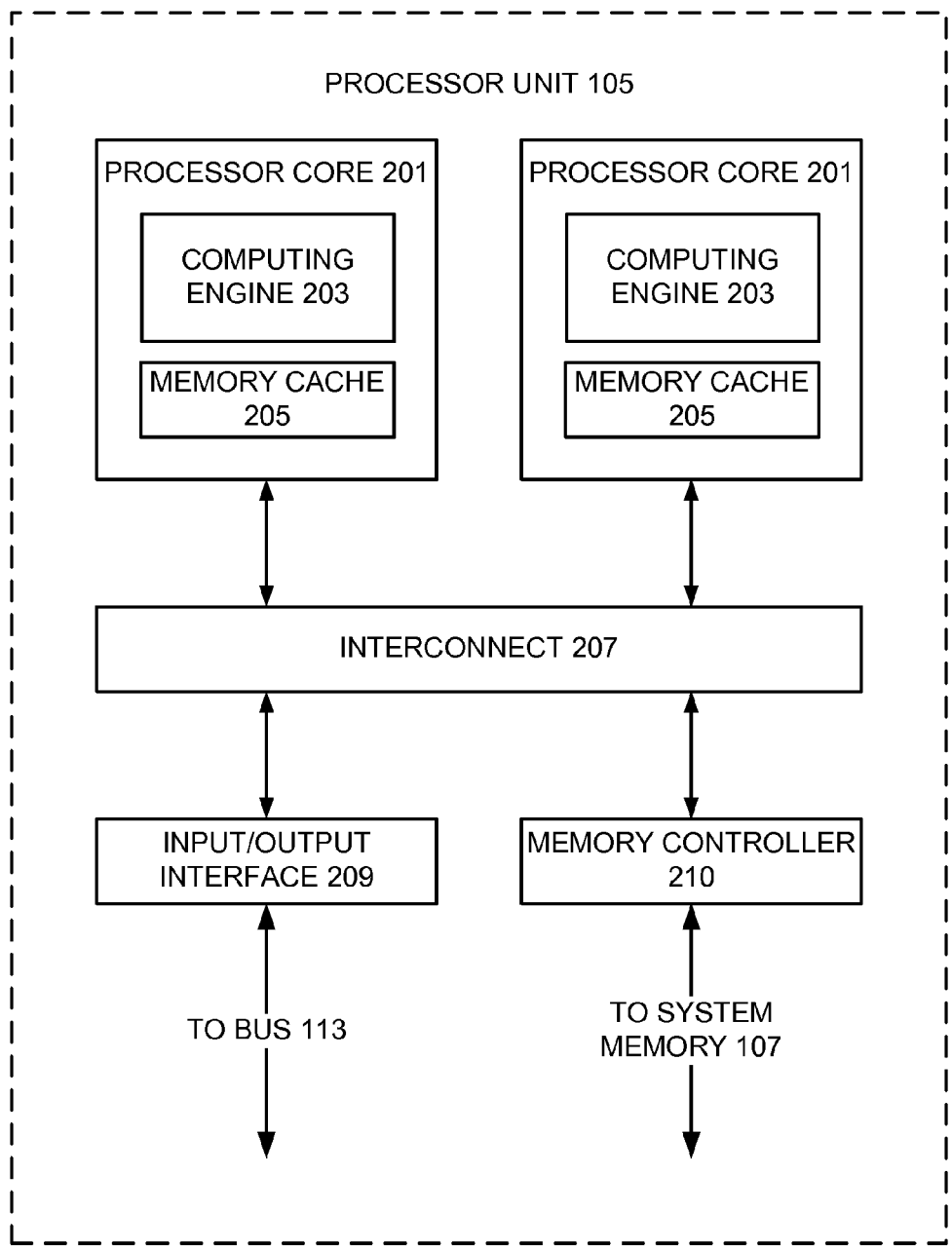

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210 The input/output interface 209 provides a communication interface between the processor unit 201 and the bus 113. Similarly, the memory controller 210 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Reset Verification

Figure 3:
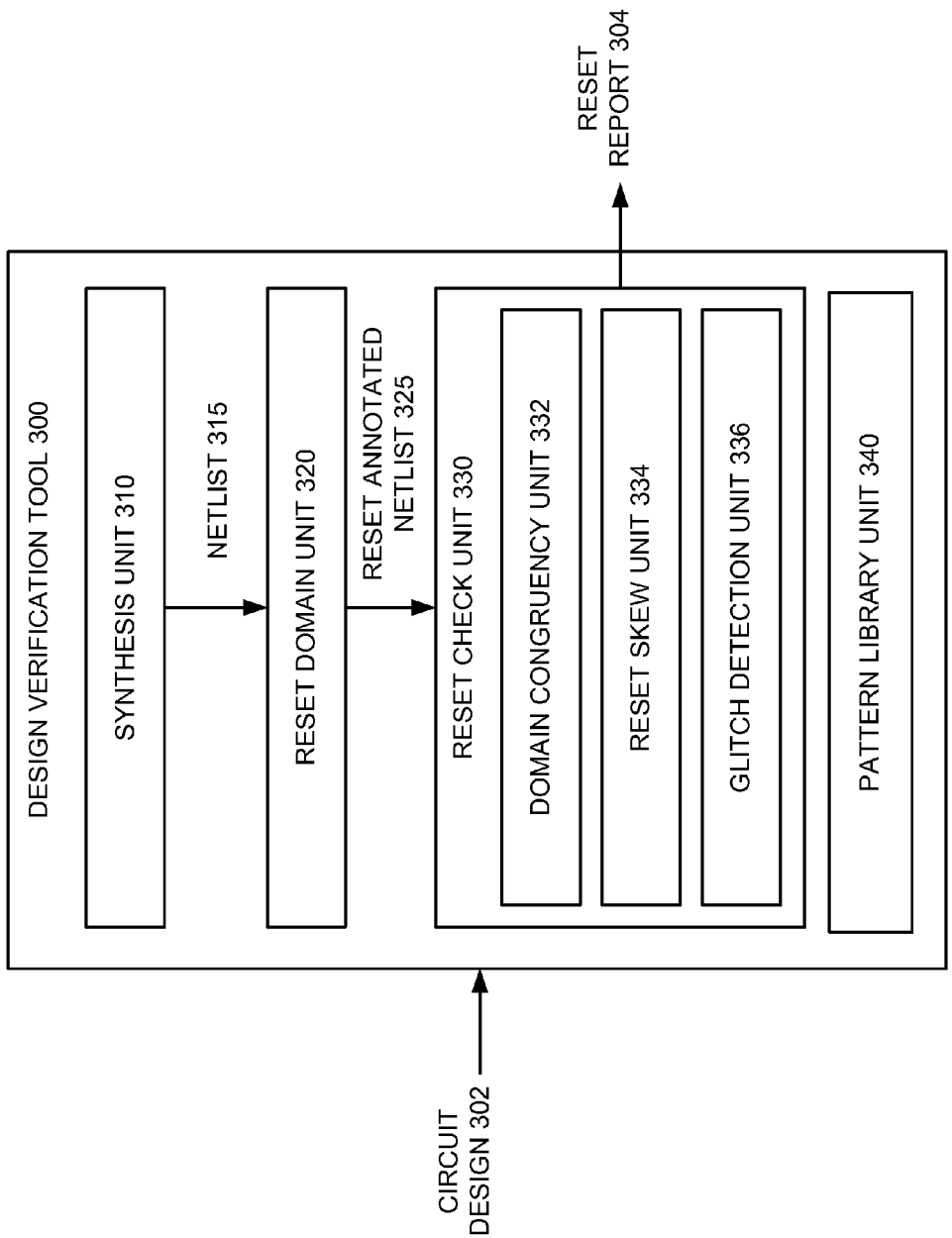
FIG. 3 illustrates an example of a design verification tool capable of performing reset verification implemented according to various embodiments of the invention.
Figure 4:
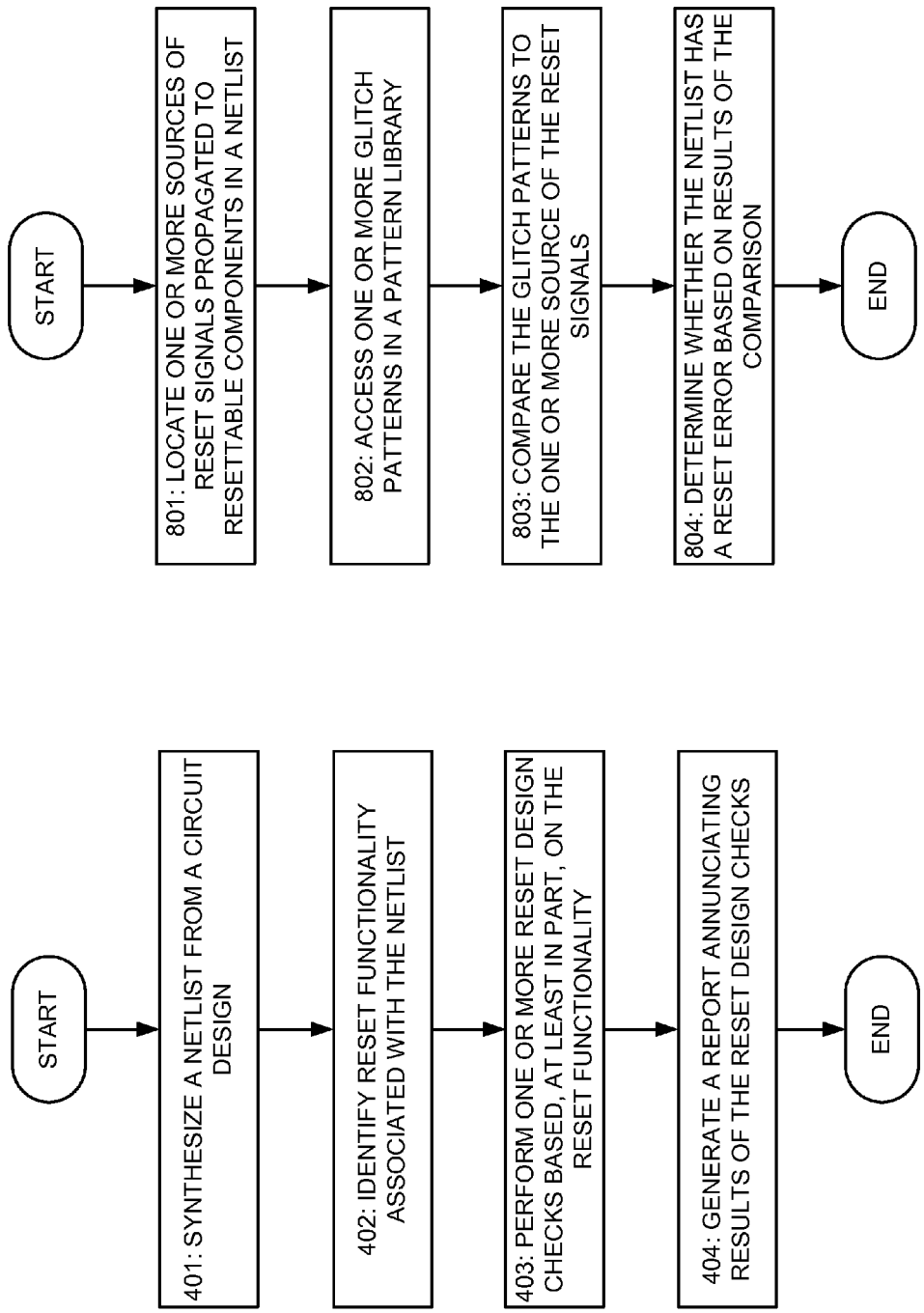
FIG. 4 illustrates a flowchart showing an example implementation of reset verification according to various embodiments of the invention.

FIG. 3 illustrates an example of a design verification tool 300 capable of performing reset verification and FIG. 4 illustrates a flowchart showing an example implementation of reset verification by the design verification tool 300 according to various embodiments of the invention. Referring to FIGS. 3 and 4, the design verification tool 300 can receive a circuit design 302 modeling an electronic device at a register transfer level (RTL), for example, with code in a hardware description language (HDL), such as Verilog, Very high speed integrated circuit Hardware Design Language (VHDL), or the like. The circuit design 302 can describe the electronic device both in terms of an exchange of data signals between components in the electronic device, such as hardware registers, flip-flops, combinational logic, or the like, and in terms of logical operations that can be performed on the data signals in the electronic device.

In a block 401, the design verification tool 300 can synthesize a netlist 315 from the circuit design 302. The netlist 315 can model the electronic device at one or more levels of abstraction, such as a gate-level, schematic-level, or transistor-level, and describe the electronic device as groups of parts, devices, gates, or expressions along with their associated connectivity. For example, the design verification tool 300 can include a synthesis unit 310 to convert the circuit design 302 into the netlist 315. In some embodiments, a tool external from the design verification tool 300 can synthesize the circuit design 302 into the netlist 315 and provide the netlist 315 to the design verification tool 300, for example, in lieu of or in addition to the circuit design 302.

In a block 402, the design verification tool 300 can identify reset functionality associated with the netlist 315. For example, the design verification tool 300 can include a reset domain unit 320 to identify reset functionality described in the netlist 315 and define reset domains for the netlist 315 based on the reset functionality. In some embodiments, the reset domain unit 320 can annotate the netlist 315 with information corresponding to the reset domains, generating a reset annotated netlist 325.

The reset functionality can include an identification of the various reset signals capable of prompting at least one component described in the netlist 315 to reset and include a characterization of those reset signals. Although FIG. 3 shows the reset domain unit 320 identifying reset domains in the netlist 315, in some embodiments, the reset domain unit 320 can identify reset domains directly from the circuit design 302 or from other representations of the electronic device at one or more different levels of abstraction.

Embodiments of defining reset domains will be described below with reference to FIG. 5.

Figure 5:
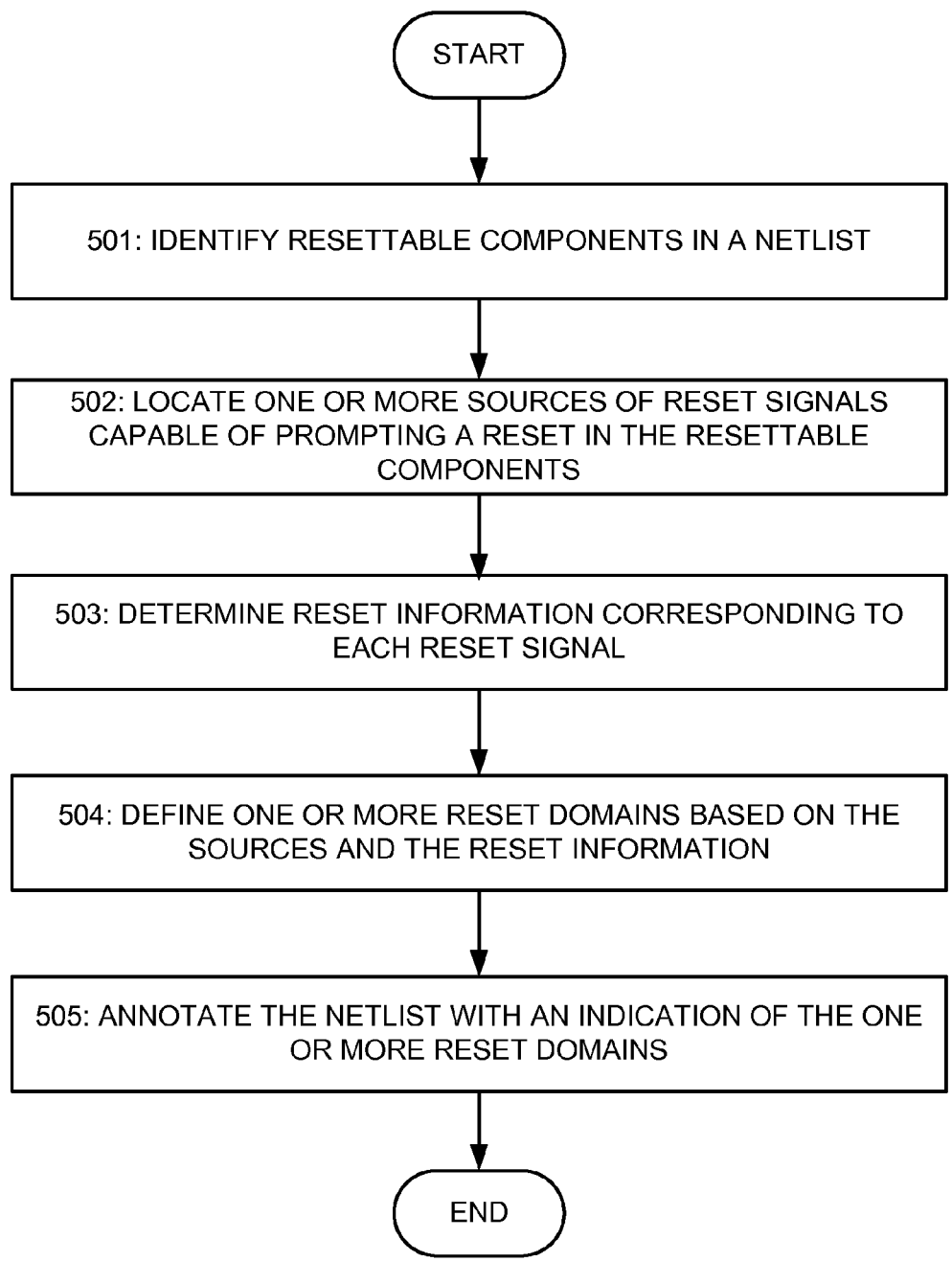
FIG. 5 illustrates a flowchart showing an example implementation of defining reset domains according to various embodiments of the invention.

FIG. 5 illustrates a flowchart showing an example implementation of defining reset domains according to various embodiments of the invention. Referring to FIG. 5, in a block 501, a design verification tool can identify resettable components in a netlist. For example, the design verification tool can analyze the netlist to identify components that can be reset in response to one or more reset signals. In some embodiments, the components can be identified by an inclusion of a reset pin or input to receive a reset signal, or an inclusion of functionality that can reset the components.

In a block 502, the design verification tool can locate one or more sources of reset signals capable of prompting reset in the resettable components. In some embodiments, the design verification tool can derive the sources of reset signals based on connectivity of the resettable components to various nets in the netlist, which can provide the reset signals to the resettable components. The design verification tool can generate a reset tree for the netlist based on the location of the sources of the reset signals, which, in some embodiments, can be performed automatically by the design verification tool. The reset tree can illustrate reset connectivity from root nodes corresponding to sources of the reset signals to its associated leaf or endpoint nodes, at least some of which can correspond to the resettable components in the netlist.

In a block 503, the design verification tool can determine reset information corresponding to each reset signal. The reset information corresponding to each reset signal can include a categorization of the reset signals, for example, as external resets, gated resets, or internal resets. The external resets can be reset signals received by the electronic device via an external port or pin, such as reset pin, which the electronic device can propagate as reset signals to various resettable components in the electronic device. The gated resets can be reset signals generated by combinational logic or gates in the electronic device. The internal resets can be soft-resets, for example, initiated by software executed in the electronic device.

The reset information corresponding to each reset signal also can include an identification of an active condition for the reset signals, such as active-high or active-low. For example, a reset signal can prompt reset of at least one resettable component in a logical-high state (active-high condition) or in a logical-low state (active-low condition. The reset information corresponding to each reset signal also can include an identification of assertion timing, such as whether the reset signals prompt reset of the resettable components synchronously or asynchronously with a corresponding clock signal received by those resettable components.

In some embodiments, the design verification tool can determine some of the reset information through an analysis of the resettable devices, the sources of the reset signals, reset signal propagation paths, or the like. The analysis of the resettable device can indicate whether the resettable devices reset in response to a logical-high state or logical-low state. The analysis of the sources of the reset signals can indicate when and/or how the reset signals are asserted by the sources of the reset signals. The analysis of the reset signal propagation paths can detect whether changes in the reset signal occurred in-route from the sources to the corresponding resettable components. For example, the design verification tool can determine an active condition for the reset signals based, at least in part, on a presence of logic gates, such as inverters, in the propagation path for the reset signals.

In a block 504, the design verification tool can define one or more reset domains based on the sources of reset signals, and possibly the reset information. A reset domain can describe a set of one or more reset signals that prompt reset of resettable components in a synchronous (or near synchronous) manner. Each reset domain can have a corresponding a reset tree, which, as discussed above, can identify a source of a reset signal, a propagation path through the electronic device, and resettable components configured to receive the reset signal for that reset domain. In some embodiments, the design verification tool can correlate the reset signal sources and the reset information to corresponding resettable components, and then group the resettable components with common sources and/or reset information to form or define the reset domains. Since a netlist can include components capable of being reset in response to multiple different reset signals, some of the reset domains can overlap each other.

In a block 505, the design verification tool can annotate the netlist with an indication of the one or more reset domains. This optional procedure can allow downstream functionality in the design verification tool (or by a tool external to the design verification tool) the ability to perform analysis on the netlist with information regarding reset functionality in the netlist. In some embodiments, the indication annotated in the net list can identify which reset domain associates with each resettable component and possibly define the characteristics of each reset domain.

Referring back to FIGS. 3 and 4, in a block 403, the design verification tool 300 can perform one or more reset design checks based, at least in part, on the defined reset domains. The design verification tool 300 can include a reset check unit 330 to perform one or more static checks on the design of reset functionality described in the reset annotated netlist 325, or, in some embodiments, in the circuit design 302 or the netlist 315. For example, the reset check unit 330 can review the design of the electronic device along with information corresponding to reset functionality in the electronic device annotated in the reset annotated netlist 325 to determine whether the design of the electronic device has any configuration that may cause an error in an operation of the reset functionality.

The reset check unit 330 can include a domain congruency unit 332 to determine whether sets of resettable components in the reset annotated netlist 325 have congruency between reset domains and clock domain. Since certain sets of resettable components in the reset annotated netlist 325 with a common clock domain should also have a common reset domain to avoid potential reset design errors, the domain congruency unit 332 can utilize the reset annotated netlist 325 to identify the sets of resettable components having a common clock domain and determine whether the identified sets of resettable components also have a common reset domain. In some embodiments, when the identified sets of resettable components do not have a common reset domain, the domain congruency unit 332 can detect a reset design error corresponding to the identified sets of resettable components. Embodiments of the domain congruency check will be described below with reference to FIGS. 6A and 6B.

Figure 6A:
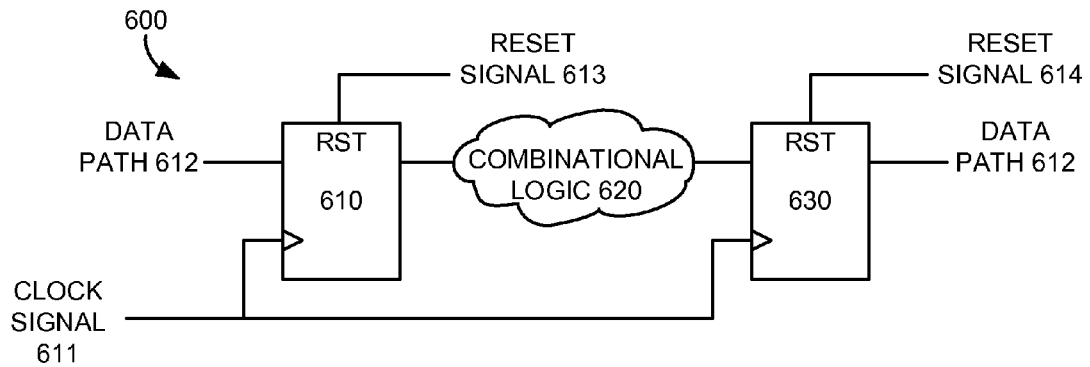
FIGS. 6A-6B illustrate an example of a domain congruency check according to various examples of the invention.
Figure 6B:
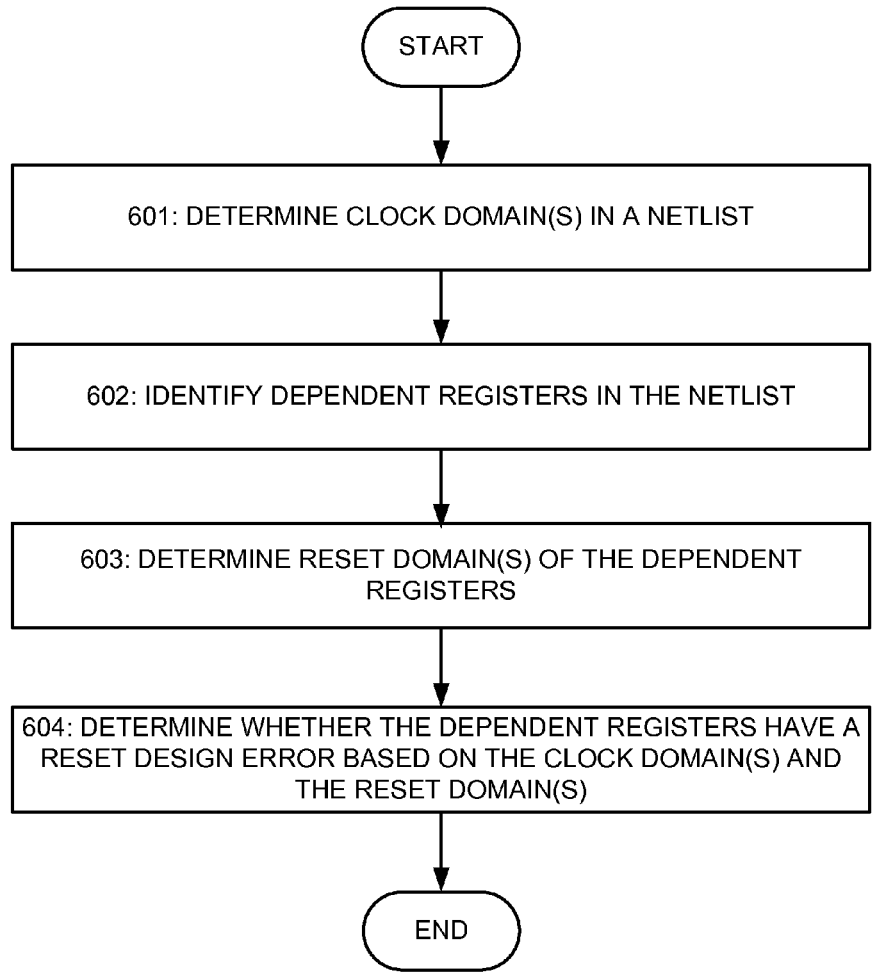

FIGS. 6A-6B illustrate an example of a domain congruency check according to various examples of the invention. Referring to FIG. 6A, an example portion 600 of an electronic device is shown as having a configuration or design that can cause a reset error during operation of the electronic device, called a reset design error. The portion 600 can include registers 610 and 630, which can latch data from a data path 612 in response to a common clock signal 611. These registers 610 and 630 can be disposed sequentially in the data path 612, for example, with the register 610 configured to output data on the data path 612 that can be subsequently latched by the register 630, possibly with intervening combinational logic 620 disposed in the data path 612 between the registers 610 and 630. Since register 630 can receive data output from register 610, the registers 610 and 630 can together be described as dependent registers.

The registers 610 and 630 also can be resettable in response to reset signals 613 and 614, respectively, from different reset domains. A proper reset of the portion 600 of the electronic device would reset both registers 610 and 630 synchronously or close enough in time so the register 630, after de-assertion of the reset signal 614, does not latch data that was output from register 610 prior to assertion of the reset signal 613. Since reset signals 613 and 614 are from different reset domains, they can operate asynchronously from each other, which potentially could cause the register 630, after de-assertion of the reset signal 614, to latch data that was output from register 610 prior to assertion of the reset signal 613.

Referring to FIG. 6B, the flow chart can describe a domain congruency check to determine whether dependent registers described in a netlist have a design or configuration similar to that discussed above with reference to FIG. 6A. In a block 601, the design verification tool can determine clock domain(s) in a netlist. The design verification tool can analyze the netlist for information corresponding to clock domain analysis previously performed and annotated into the netlist. In some embodiments, when a previous clock domain analysis has not been performed or the design verification tool does not have access to the results of a previously performed clock domain analysis, the design verification tool can perform clock domain analysis on the netlist to identify the clock domains present in the netlist and correlate them to clock-driven components in the netlist.

In a block 602, a design verification tool can identify dependent registers, such as registers 610 and 630, in the netlist. Since dependent registers reside in a common clock domain, disposed sequentially in a data path, possibly with intervening combinational logic disposed between them in the data path, the design verification tool can identify registers that have these characteristics as dependent registers.

In a block 603, the design verification tool can determine reset domain(s) of the dependent registers. The design verification tool can analyze the netlist for information corresponding to reset domain analysis previously performed and annotated into the netlist. The information corresponding to reset domains can at least include a correlation of resettable components in the netlist to one or more reset domains. In some embodiments, the design verification tool can perform reset domain analysis on the netlist, which can be similar to the process discussed above with reference to FIG. 5.

In a block 604, the design verification tool can determine whether the dependent registers have a reset design error based on the clock domain(s) and the reset domain(s) associated with the dependent registers. For example, the design verification tool can review the reset domains of the dependent registers and detect a reset design error when the registers correspond to different reset domains. Although FIGS. 6A and 6B discuss registers as an example resettable components to analyze for reset design errors, in some embodiments, other resettable components may form a dependent set of components for the design verification tool to analyze for reset design errors.

Referring back to FIGS. 3 and 4, the reset check unit 330 can include a reset skew unit 334 to determine whether reset signal skew in sets of resettable components of the reset annotated netlist 325 can cause an improper reset operation. Even when a set of resettable components in the reset annotated netlist 325 has both a common clock domain and a common reset domain, a propagation delay in the reset signal provided to the resettable components in the set can cause a potential reset design error. The reset check unit 330 can utilize the reset annotated netlist 325 to identify the sets of resettable components and utilize the reset information in the reset annotated netlist 325 to determine whether the identified sets of resettable components can both be reset within a sufficient window of time to avoid the improper reset operation. Embodiments of a reset skew check will be described below with reference to FIGS. 7A and 7B.

Figure 7A:
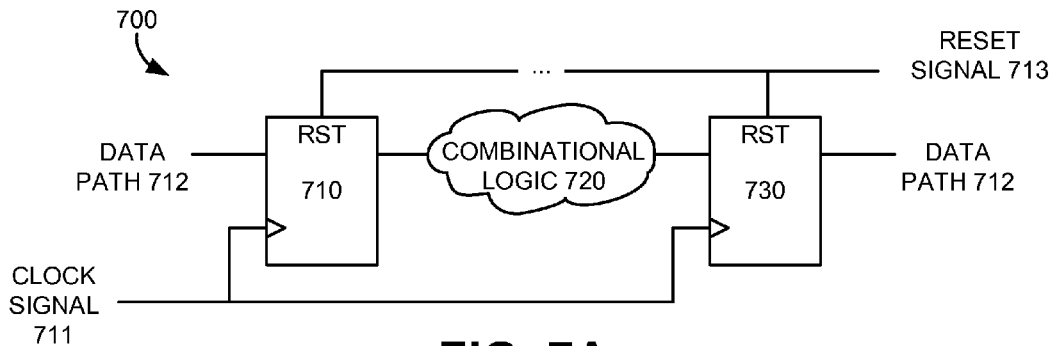
FIGS. 7A-7B illustrate an example of a reset skew check according to various examples of the invention.
Figure 7B:
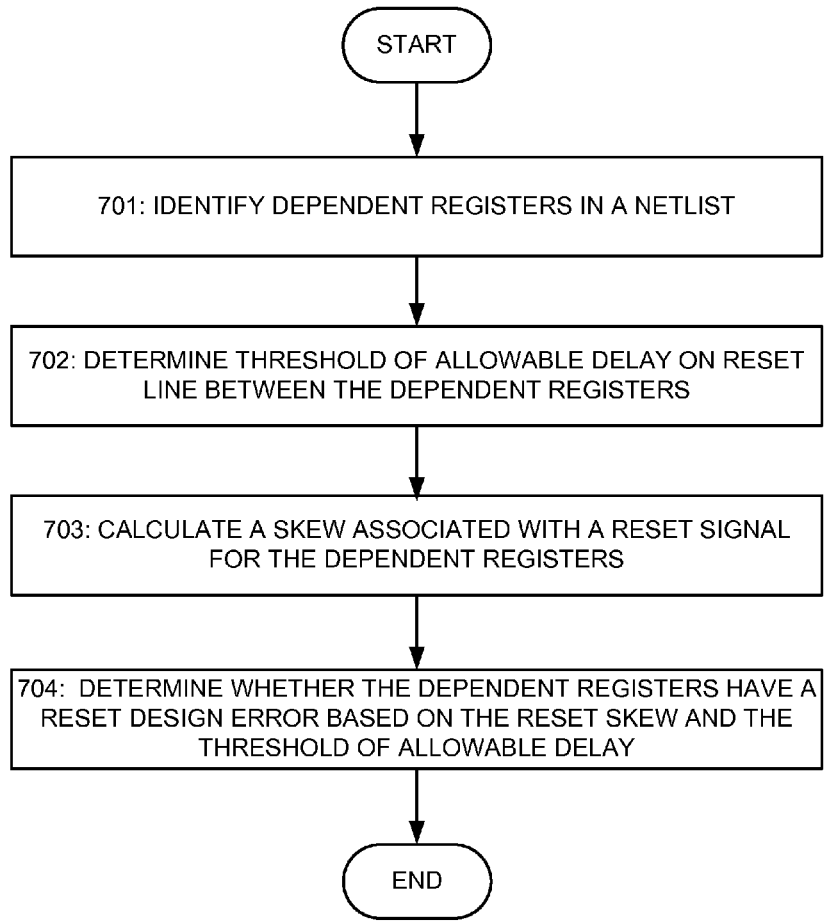

FIGS. 7A-7B illustrate an example of a reset skew check according to various examples of the invention. Referring to FIG. 7A, an example portion 700 of an electronic device is shown as having a configuration or design that can cause a reset error during operation of the electronic device, called a reset design error. The portion 700 can include registers 710 and 730, which can latch data from a data path 712 in response to a common clock signal 711. These registers 710 and 730 can be disposed sequentially in the data path 712, for example, with the register 710 configured to output data on the data path 712 that can be subsequently latched by the register 730, possibly from intervening combinational logic 720 disposed in the data path 712 between the registers 710 and 730. Since register 730 receives data output from register 710, the registers 710 and 730 can together be described as dependent registers.

The registers 710 and 730 also can be resettable in response to a common reset signal 713 from common reset domains. A proper reset of the portion 700 of the electronic device would reset both registers 710 and 730 synchronously or close enough in time so the register 730, after de-assertion of the reset signal 713, does not latch data that was output from register 710 prior to assertion of the reset signal 713. In some configurations of portion 700 of the electronic device, the reset signal 713 can have propagation delay between the registers 610 and 630, which potentially could cause the register 730, after de-assertion of the reset signal 713, to latch data that was output from register 710 prior to assertion of the reset signal 713.

Referring to FIG. 7B, in a block 701, a design verification tool can identify dependent registers, such as registers 710 and 730, in a netlist. Since dependent registers reside in a common clock domain, disposed sequentially in a data path, possibly with intervening combinational logic disposed between them in the data path, the design verification tool can identify registers that have these characteristics as dependent registers.

In a block 702, the design verification tool can determine a threshold of allowable reset signal propagation delay between the dependent registers. Although registers 710 and 730 reside in a common reset domain, they can receive the reset signal 713 at different times, for example, due to a reset signal propagation delay or reset signal skew between the dependent registers. In some instances, this propagation delay can be sufficiently large such that register 730 can exit reset and latch data from the data path 712 that corresponds to pre-reset data from the register 710. Thus, the design verification tool can determine a threshold of reset signal propagation delay between the dependent registers, which can ensure the register 730 exits reset and latches data from the data path 712 that corresponds to post-reset data from the register 710. In some embodiments, the design verification tool can determine the threshold of allowable reset signal propagation delay between the dependent registers based on one or more of a propagation delay through the data path 712 between the dependent registers, a duration the reset signal 713 is asserted, latching characteristics of the register 730, such as set-up and hold times, arrival of the clock signal 711 at the register 713, or the like.

In a block 703, the design verification tool can calculate a skew associated with a reset signal 713 for the dependent registers. The design verification tool can locate information corresponding to reset domains in a reset annotated netlist, and calculate a delay between the reset signal 713 arriving at register 730 and at register 710. In some embodiments, the design verification tool can calculate the reset skew by analyzing a reset tree corresponding to the reset domain associated with the reset signal 713 and estimating or calculating a propagation delay of the reset signal 713 between the dependent registers.

In a block 704, the design verification tool can determine whether the dependent registers have a reset design error based on the reset skew and the threshold of allowable delay. In some embodiments, the design verification tool can compare the reset skew and the threshold of allowable delay, and when the reset skew exceeds the threshold of allowable delay, the design verification tool can detect the dependent registers have a reset design error.

Referring back to FIGS. 3 and 4, the reset check unit 330 can include a glitch detection unit 336 to determine whether source of reset signals in the reset annotated netlist 325 can erroneously assert reset signals, for example, due to a glitch. The glitch detection unit 336 can identify the sources of the reset signals in the reset annotated netlist 325 and compare the configurations of the sources against component configurations known to induce signal glitches. In some embodiments, the design verification tool 300 can include a pattern library unit 340 to store the known component configurations for comparison against the reset signal source configurations. Although FIG. 3 shows the pattern library unit 340 being located in the design verification tool 300, in some embodiment, the pattern library unit 340 can be located externally to the design verification tool 300. Embodiments of a glitch detection check will be described below with reference to FIG. 8.

FIG. 8 illustrates a flowchart showing an example implementation of a reset glitch check according to various embodiments of the invention. Referring to FIG. 8, in a block 801, a design verification tool can locate one or more sources of reset signals propagated to resettable components in a netlist. In some embodiments, the design verification tool can review reset information annotated into the netlist, for example, by a reset domain unit of the design verification tool, to identify the sources of reset signals. Otherwise, the design verification tool can derive the sources of reset signals similarly to the process described above with reference to FIG. 5.

In a block 802, the design verification tool can access one or more glitch patterns in a pattern library, such as the pattern library unit 340. The pattern library can store glitch patterns in a memory device or system, which can be accessible by the design verification tool, or provide the glitch patterns to the design verification tool, for example, with the circuit design or netlist.

In a block 803, the design verification tool can compare the glitch patterns to the one or more source of the reset signals, and, in a block 804, the design verification tool can determine whether the netlist has a reset error based on results of the comparison. When at least one of the glitch patterns matches at least a portion of a reset signal source, the design verification tool can determine that the matched reset signal source includes a reset design error.

Referring back to FIGS. 3 and 4, in a block 404, the design verification tool can generate a report annunciating results of the reset design checks. For example, the reset check unit 330 can develop the report, which can identify any reset design errors discovered by the various static reset checks it performed and optionally list details of the reset design error. The report also can include an identification of components or sources reviewed by the reset check unit 330 and/or any reset domain information determined during the static reset checks by the design verification tool.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    detecting, by a computing system, reset functionality in a circuit design by locating sources of reset signals configured to prompt reset of resettable components in the circuit design and analyzing the circuit design to identify reset information corresponding to characteristics of the reset signals;
    identifying, by the computing system, a portion of the circuit design having a set of the resettable components; and
    determining, by the computing system, the portion of the circuit design includes an error corresponding to the set of the resettable components based, at least in part, on the reset functionality in the circuit design.

2. The method of claim 1, further comprising:
    identifying, by the computing system, clock domains in the circuit design; and
    defining, by the computing system, reset domains for the circuit design based on the reset functionality in the circuit design, wherein determining the portion of the circuit design includes the error further comprises determining the portion of the circuit design includes the error when the set of the resettable components has a single clock domain and multiple reset domains.

3. The method of claim 1, wherein determining the circuit design includes the error corresponding to the set of the resettable components further comprises:
    calculating reset signal skew for the set of resettable components based on a propagation delay associated with at least one of the reset signals in the circuit design; and
    determining the portion of the circuit design includes the error when the reset signal skew for the set of the resettable components exceeds a threshold of allowable reset signal delay.

4. The method of claim 1, further comprising defining, by the computing system, reset domains for the circuit design based, at least in part, on the sources of the reset signals and the reset information corresponding to each reset signal.

5. The method of claim 1, further comprising:
    comparing, by the computing system, the sources of the reset signals against one or more predetermined patterns; and
    when at least one of the sources of the reset signals matches at least one of the predetermined patterns, determining, by the computing system, the matched source is capable of inducing a glitch in a corresponding reset signal, which corresponds to the error.

6. The method of claim 1, further comprising generating, by the computing system, a reset report configured to annunciate a presence of the error in the circuit design.

7. The method of claim 1, wherein the set of resettable components includes a first resettable component configured to drive data towards a second resettable component.

8. A system comprising:
    a memory device configured to store machine-readable instructions; and
    a computing system including one or more processing devices, in response to executing the machine-readable instructions, configured to detect reset functionality in a circuit design by locating sources of reset signals configured to prompt reset of resettable components in the circuit design and analyzing the circuit design to identify reset information corresponding to characteristics of the reset signals, identify a portion of the circuit design having a set of the resettable components, and determine the portion of the circuit design includes an error corresponding to the set of the resettable components based, at least in part, on the reset functionality in the circuit design.

9. The system of claim 8, wherein the one or more processing devices, in response to executing the machine-readable instructions, are further configured to identify clock domains in the circuit design, define reset domains for the circuit design based on the reset functionality in the circuit design, and determine the portion of the circuit design includes the error when the set of the resettable components has a single clock domain and multiple reset domains.

10. The system of claim 8, wherein the one or more processing devices, in response to executing the machine-readable instructions, are further configured to calculate reset signal skew for the set of resettable components based on a propagation delay associated with at least one of the reset signals in the circuit design, and determine the portion of the circuit design includes the error when the reset signal skew for the set of resettable components exceeds a threshold of allowable reset signal delay.

11. The system of claim 8, wherein the one or more processing devices, in response to executing the machine-readable instructions, are further configured to define reset domains for the circuit design based, at least in part, on the sources of the reset signals and the reset information corresponding to each reset signal.

12. The system of claim 8, wherein the one or more processing devices, in response to executing the machine-readable instructions, are further configured to compare the sources of the reset signals against one or more predetermined patterns, and determine the matched source is capable of inducing a glitch in a corresponding reset signal, which corresponds to the error, when at least one of the sources of the reset signals matches at least one of the predetermined patterns.

13. The system of claim 8, wherein the one or more processing devices, in response to executing the machine-readable instructions, are further configured to generate a reset report configured to annunciate a presence of the error in the circuit design.

14. An apparatus comprising at least one computer-readable memory device storing instructions configured to cause one or more processing devices to perform operations comprising:
   detecting reset functionality in a circuit design by locating sources of reset signals configured to prompt reset of resettable components in the circuit design and analyzing the circuit design to identify reset information corresponding to characteristics of the reset signals;
   identifying a portion of the circuit design having a set of the resettable components; and
   determining the portion of the circuit design includes an error corresponding to the set of the resettable components based, at least in part, on the reset functionality in the circuit design.

15. The apparatus of claim 14, wherein the instructions are configured to cause the one or more processing devices to perform operations further comprising:
   identifying clock domains in the circuit design; and
   defining reset domains for the circuit design based on the reset functionality in the circuit design, wherein determining the portion of the circuit design includes the error further comprises determining the portion of the circuit design includes the error when the set of the resettable components has a single clock domain and multiple reset domains.

16. The apparatus of claim 14, wherein determining the circuit design includes the error corresponding to the set of the resettable components further comprises:
   calculating reset signal skew for the set of resettable components based on a propagation delay associated with at least one of the reset signals in the circuit design; and
   determining the portion of the circuit design includes the error when the reset signal skew for the set of the resettable components exceeds a threshold of allowable reset signal delay.

17. The apparatus of claim 14, wherein the instructions are configured to cause the one or more processing devices to perform operations further comprising defining reset domains for the circuit design based, at least in part, on the sources of the reset signals and the reset information corresponding to each reset signal.

18. The apparatus of claim 14, wherein the instructions are configured to cause the one or more processing devices to perform operations further comprising:
   comparing the sources of the reset signals against one or more predetermined patterns; and
   when at least one of the sources of the reset signals matches at least one of the predetermined patterns, determining the matched source is capable of inducing a glitch in a corresponding reset signal, which corresponds to the error.

19. The apparatus of claim 14, wherein the instructions are configured to cause the one or more processing devices to perform operations further comprising generating a reset report configured to annunciate a presence of the error in the circuit design.

20. The apparatus of claim 14, wherein the set of resettable components includes a first resettable component configured to drive data towards a second resettable component.

\* \* \* \* \*